(12) United States Patent
Huang et al.

(10) Patent No.: US 8,921,977 B2
(45) Date of Patent: Dec. 30, 2014

(54) CAPACITOR ARRAY AND METHOD OF FABRICATING THE SAME

(75) Inventors: Jen Jui Huang, Taoyuan County (TW); Che Chi Lee, New Taipei (TW); Shih Shu Tsai, Zhongli (TW); Cheng Shun Chen, Zhunan Township, Miaoli County (TW); Shao Ta Hsu, Luzhu Township, Taoyuan County (TW); Chao Wen Lay, Gongguan Township, Miaoli County (TW); Chun I Hsieh, Taoyuan (TW); Ching Kai Lin, New Taipei (TW)

(73) Assignee: Nan Ya Technology Corporation, Tao-Yuan Hsien (TW)

( * ) Notice: Subject to any disclaimer, the term of this patent is extended or adjusted under 35 U.S.C. 154(b) by 34 days.

(21) Appl. No.: 13/333,564

(22) Filed: Dec. 21, 2011

(65) Prior Publication Data

US 2013/0161786 A1    Jun. 27, 2013

(51) Int. Cl.
*H01L 29/92* (2006.01)
*H01L 27/108* (2006.01)
*H01L 27/105* (2006.01)

(52) U.S. Cl.
CPC ........ *H01L 27/10817* (2013.01); *H01L 27/105* (2013.01)

USPC .... 257/532; 257/300; 257/296; 257/E21.008; 438/238; 438/239; 438/386; 438/399

(58) Field of Classification Search
CPC . H01L 27/10817; H01L 28/91; H01L 27/105; H01L 27/10894; G11C 11/16
USPC .......... 257/532, E29.342, E21.008, 300, 296; 438/238, 239, 386, 399
See application file for complete search history.

(56) References Cited

U.S. PATENT DOCUMENTS

| | | | | |
|---|---|---|---|---|
| 4,855,801 A * | 8/1989 | Kuesters | ........................ | 257/306 |
| 6,482,696 B2 * | 11/2002 | Park | ............................. | 438/253 |
| 6,500,763 B2 * | 12/2002 | Kim et al. | ..................... | 438/689 |
| 6,537,874 B2 * | 3/2003 | Nakamura et al. | ............ | 438/253 |
| 6,822,280 B2 * | 11/2004 | Ito et al. | ........................ | 257/296 |
| 6,867,096 B2 * | 3/2005 | Cho et al. | ...................... | 438/256 |
| 7,655,968 B2 * | 2/2010 | Manning | ........................ | 257/302 |

* cited by examiner

*Primary Examiner* — Thinh T Nguyen
(74) *Attorney, Agent, or Firm* — Juan Carlos A. Marquez; Bacon & Thomas PLLC

(57) ABSTRACT

A capacitor array includes a plurality of capacitors and a support frame. Each capacitor includes an electrode. The support frame supports the plurality of electrodes and includes a plurality of support structures corresponding to the plurality of electrodes. Each support structure may surround the respective electrode. The support frame may include oxide of a doped oxidizable material.

13 Claims, 16 Drawing Sheets

CAPACITOR ARRAY AND METHOD OF FABRICATING THE SAME

TECHNICAL FIELD

The present disclosure relates generally to a semiconductor electronic device, and relates more particularly to a semiconductor electronic device including capacitors.

BACKGROUND

A DRAM (dynamic random access memory) includes an array of DRAM cells arrayed into a matrix of rows and columns. In a typical DRAM array, the DRAM cells disposed along a column are coupled to the same bit-line, and the DRAM cells disposed along a row are coupled to the same word-line.

Each DRAM cell includes a switching transistor and a storage capacitor coupled with the switching transistor. The switching transistor can be an NMOSFET (N-channel metal oxide semiconductor field effect transistor). In a DRAM with NMOSFETs, the gate of the NMOSFET is coupled to a word-line, the drain of the NMOSFET is coupled to a bit line that can be coupled to a sense amplifier, the source of the NMOSFET is coupled to a node of the storage capacitor, and another node of the storage capacitor is coupled to a ground node.

The voltage across a storage capacitor determines the logical level of the DRAM cell. Due to the capacitance of parasitic capacitors, a storage capacitor with increased capacitance is needed to provide sufficient voltage signal. To this end, the electrodes of the storage capacitor must have sufficiently large overlapped areas, which increase the height of the storage capacitor. High storage capacitors easily slope, and some of them may lean together, resulting in the malfunction of a DRAM cell.

To overcome the slope issue, a carbon or aluminum lattice structure 19 is formed on the top portions of electrodes 17 of storage capacitors of a DRAM cell to prevent the electrodes 17 from sloping as shown in FIG. 1. The top portions of the electrodes 17 formed in the openings of a layer 12 on a substrate 11 are exposed by etching the layer 12. Carbon or aluminum is deposited on the top portions of the electrodes 17, and carbon or aluminum lattice is formed on each top portion. Adjacent lattices connect with each other to form a lattice structure 19, which can hold the top portions of the electrodes 17 at desired positions. However, holding the top portions of the electrodes 17 at fixed positions by a lattice structure 19 cannot prevent the middle portions of the electrodes 17 from being wobbly, and adjacent electrodes may contact each other if the electrodes 17 have high aspect ratios.

SUMMARY

A capacitor array of one embodiment of the present invention may include a plurality of capacitors and a support frame. Each capacitor may include an electrode. The support frame may support the plurality of electrodes and include a plurality of support structures corresponding to the plurality of electrodes. Each support structure may surround the respective electrode. The support frame may include oxide of a doped oxidizable material, such as polysilicon.

A capacitor array of another embodiment of the present invention may include a plurality of capacitors and a support frame. Each capacitor may include an electrode. The support frame may be configured for supporting the plurality of electrodes. The support frame may comprise a plurality of support structures corresponding to the plurality of electrodes. Each support structure may surround the respective electrode. The support frame may comprise a first material and a second material. The density of the first material may be higher than that of the second material.

A method of fabricating a capacitor array according to one embodiment of the present invention may comprise providing a substrate comprising a first layer of a first material and a layer of a second material below the first layer of the first material, wherein the density of the first material is higher than that of the second material; forming openings to the first layer of the first material; lining the openings; deepening the openings to expose at least a portion of the layer of the second material; oxidizing the exposed second material to form a support frame; further deepening the openings; and forming a plurality of electrodes in the openings.

The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims

DETAILED DESCRIPTION

Figure 1:
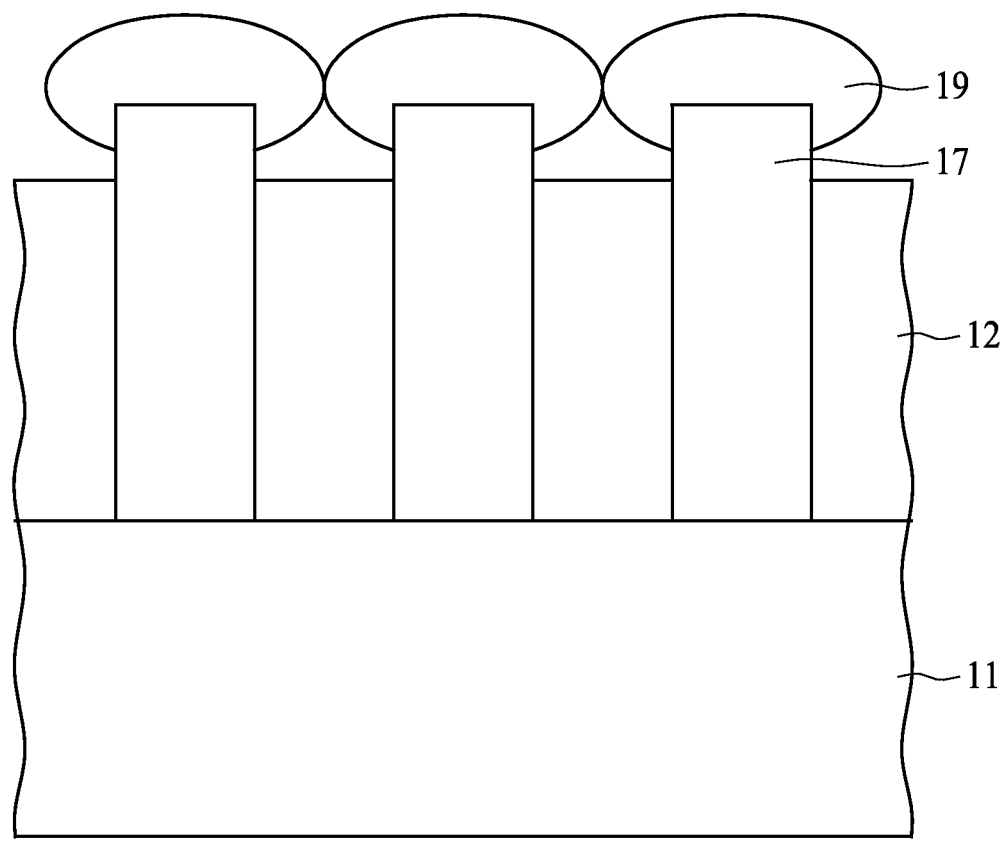
FIG. 1 illustrates a lattice structure for holding electrodes of conventional stacked capacitors.
Figure 2:
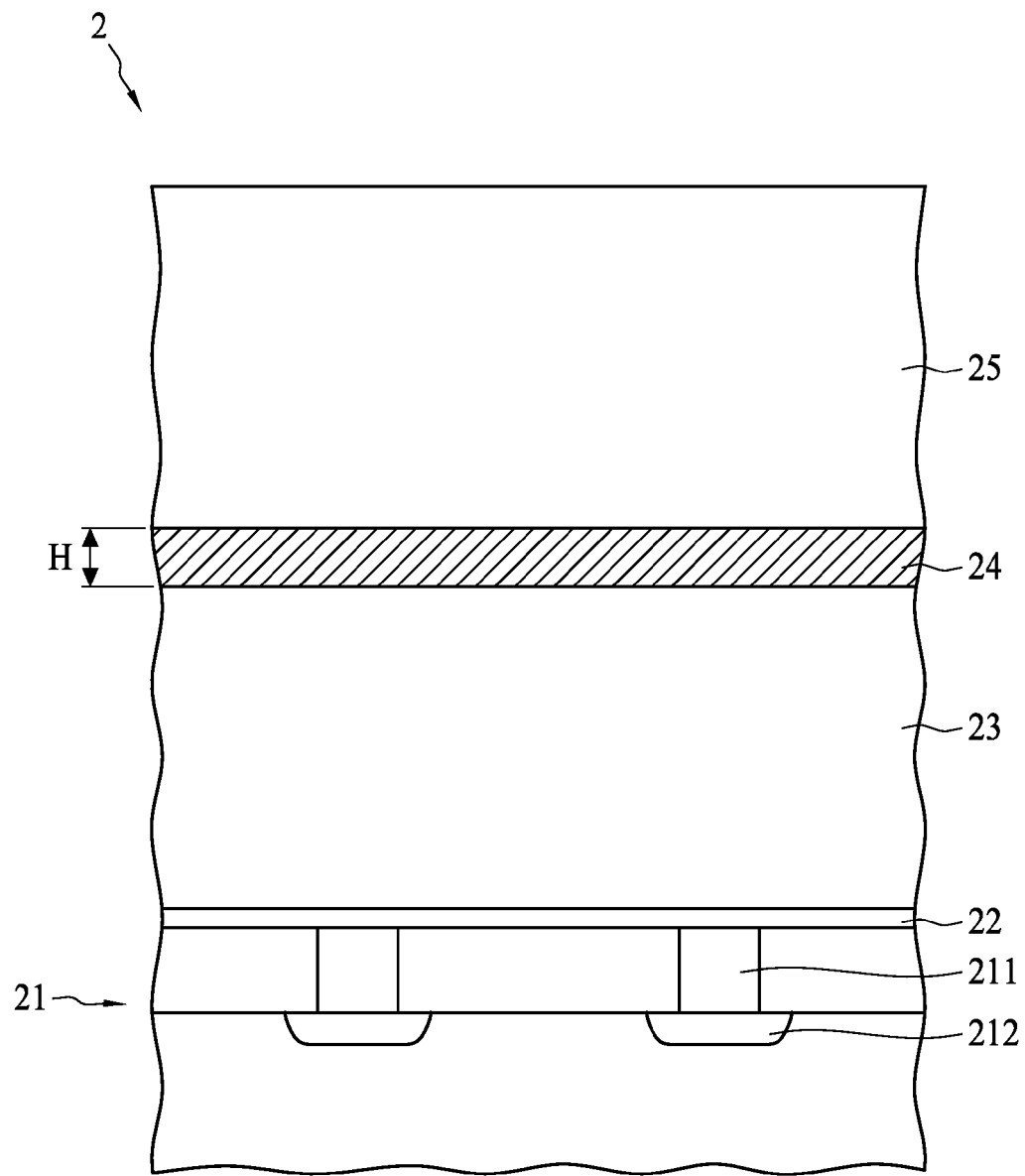
FIGS. 2 to 8 are cross-sectional views showing the steps of method of fabricating a capacitor array according to one embodiment of the present invention.

FIGS. 2 to 8 are cross-sectional views showing the steps of a method of fabricating a capacitor array 100 according to one embodiment of the present invention. Referring to FIG. 2, a substrate 2 is provided. The substrate 2 may comprise a first layer 25 of a first material and a layer 24 of a second material disposed below the first layer 25 of the first material. In some embodiments, the density of the first material may be higher than that of the second material. In some embodiments, the first material comprises oxidizable material. In some embodiments, the second material comprises oxidizable material. In some embodiments, the first material may comprise undoped oxidizable material or doped oxidizable material. The second material may comprise doped material or doped oxidizable material. In some embodiments, the first material may comprise polysilicon. The second material may comprise doped polysilicon. In some embodiments, the substrate 2 may further comprise a second layer 23 of the first material, wherein the layer 24 of the second material is between the first and second layers 23 and 25 of the first material.

In some embodiments, the substrate 2 may comprise a lower substrate portion 21 comprising a plurality of active areas 212 (i.e., source/drain regions of an access transistor) and a plurality of conductive plugs 211 connecting to the underlying corresponding active areas 212 (i.e., source/drain regions of an access transistor). The conductive plugs 211 may be conductively doped polysilicon plugs and can be separated by isolation material such as BPSG. The active areas 212 can be portions of field effect transistors previously formed by conventional fabrication steps known to those skilled in the art. The first layer 25 of the first material and the layer 24 of the second material are formed on the lower substrate portion.

The substrate 2 may further comprise a stop layer 22 formed on the lower substrate portion.

Figure 3:
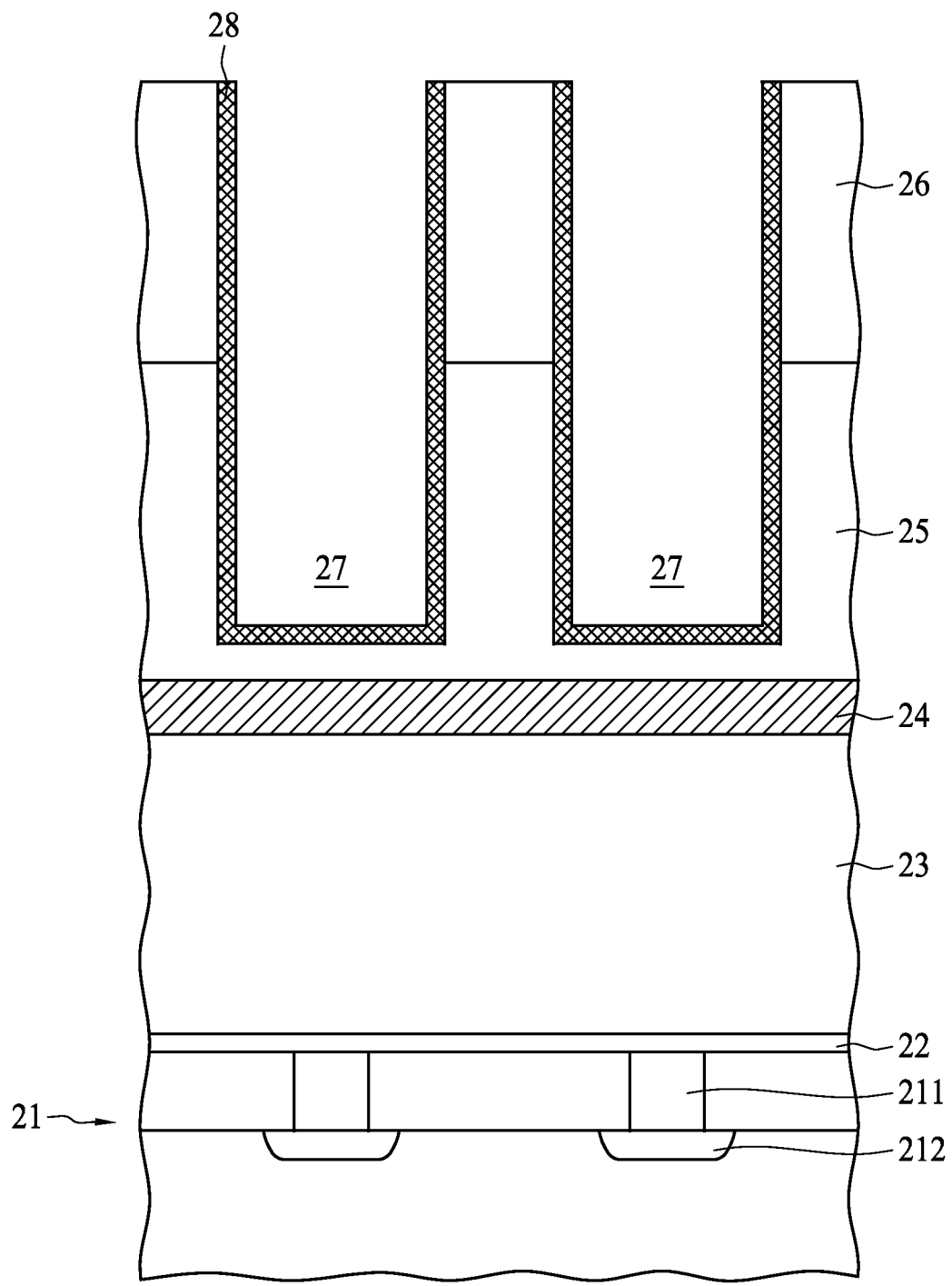

As shown in FIG. 3, a patterned mask 26 including a plurality of holes patterned to align with the conductive plugs 211 can be formed on the first layer 25 of the first material. The mask 26 may comprise carbon, oxide, nitride, or other material that can be used as a mask. Through the holes, a plurality of openings 27 are formed by, for example, a dry etch process, to the first layer 25 of the first material. Next, a liner layer 28 including, for example, silicon nitride (SiN) is formed in the openings 27 and the holes.

Figure 4:
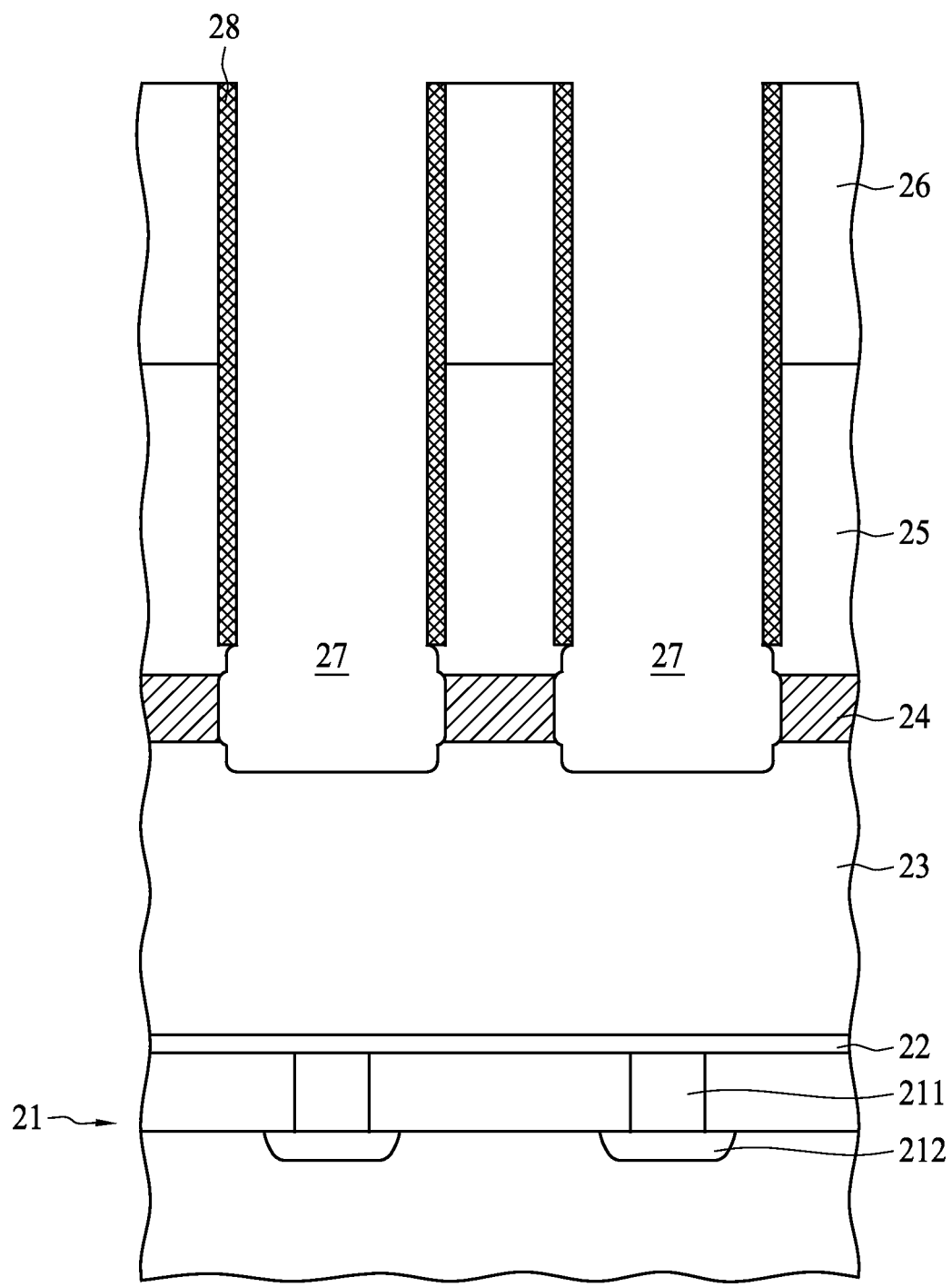

As shown in FIG. 4, a punch-thru etch is performed to remove the liner layers 28 on the bottoms of the openings 27. Next, a wet etching process is performed to deepen the openings 27, and an etched-out region including at least a portion of the layer 24 of the second material is obtained. The wet etching process can be a selective wet etch process, wherein the second material can be removed faster than the first material.

In some embodiments, the openings 27 can be formed into the first layer 25, and the openings 27 are then deepened through the layer 24 of the second material.

Figure 5:
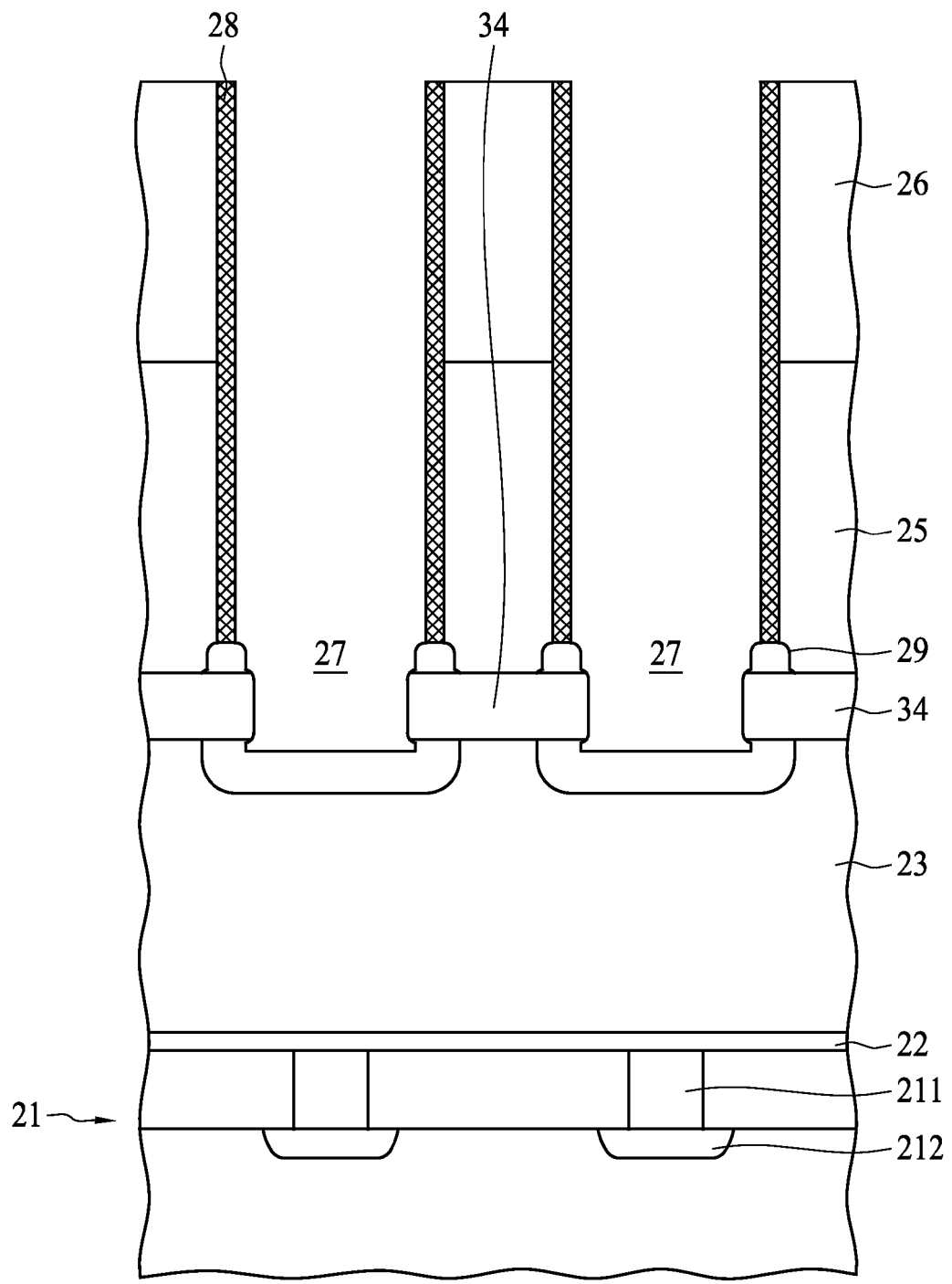

As shown in FIG. 5, an oxidation process is performed to oxidize the etched-out regions. In some embodiments, the second material can be partially oxidized via the etched-out regions. In some embodiments, the second material can be completely oxidized via the etched-out regions. The second material is oxidized to form a support frame 34. In some embodiments, portions of the layers 23 and 25 of the first material are exposed in the etched-out regions, and oxidized in the oxidation process into oxide 29 of the first material. In some embodiments, the oxidation process may be a selective oxidation process, wherein the oxide of the second material is formed faster than the oxide of the first material.

Figure 6:
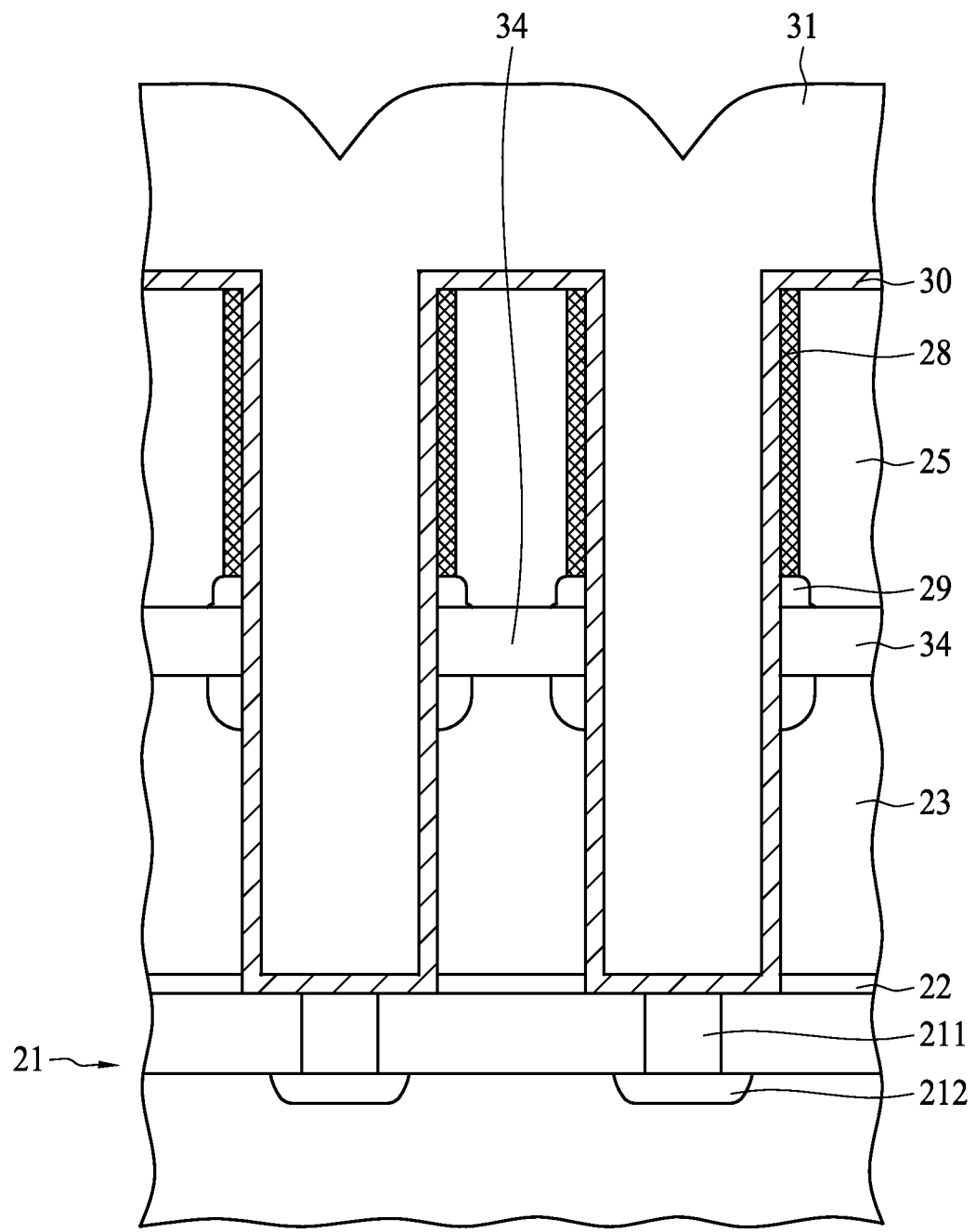

As shown in FIG. 6, an etching process is performed to further deepen the openings 27 until the stop layer 22 is reached. The exposed stop layer 22 is then removed. Next, the patterned mask 26 is removed. Thereafter, a layer of electrode material 30 is deposited. The electrode material 30 may comprise metal or polysilicon. Next, a sacrificial dielectric material 31 is deposited, covering the layer of electrode material 30. In some embodiments, the sacrificial dielectric material 31 may comprise undoped silica glass.

Figure 7:
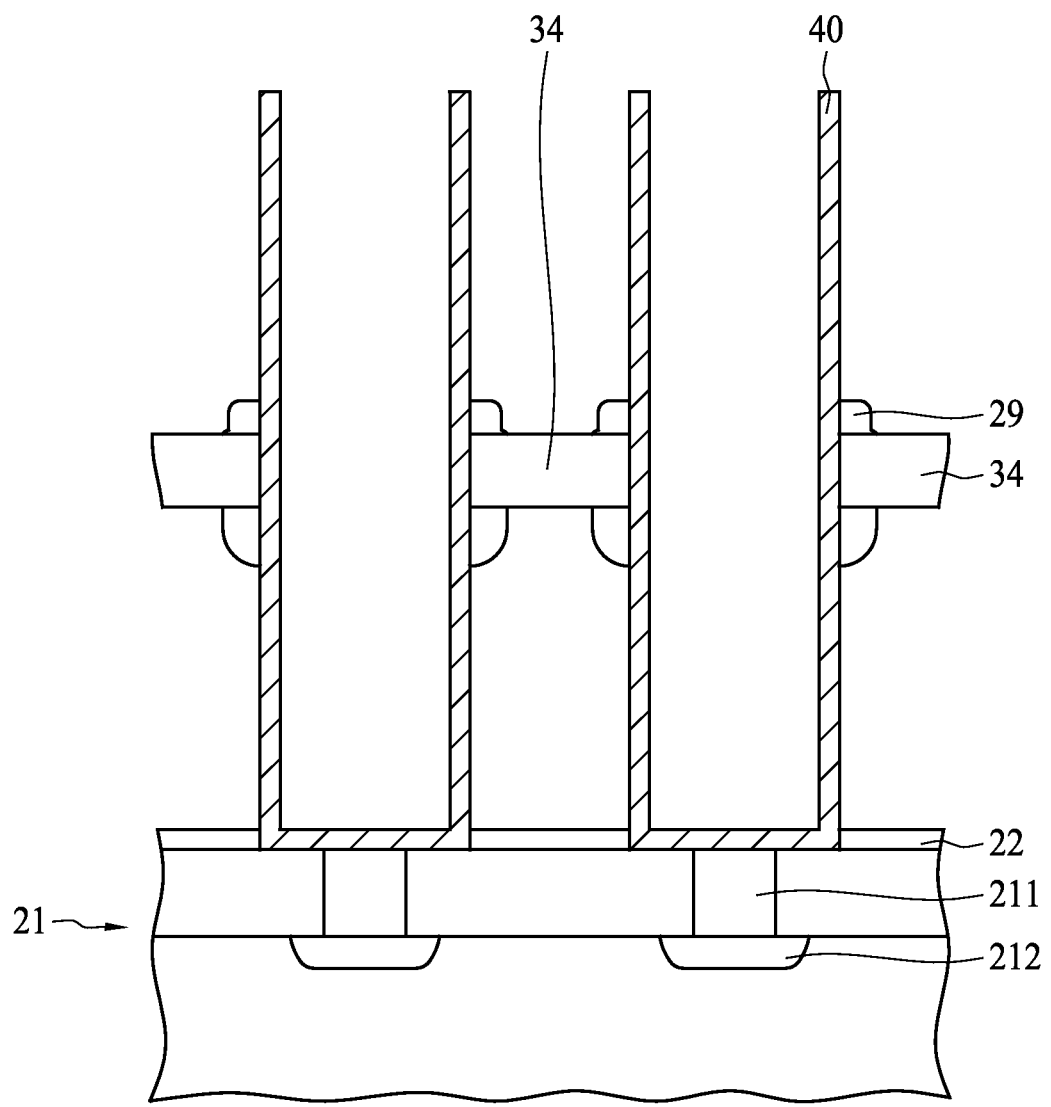
Figure 9:
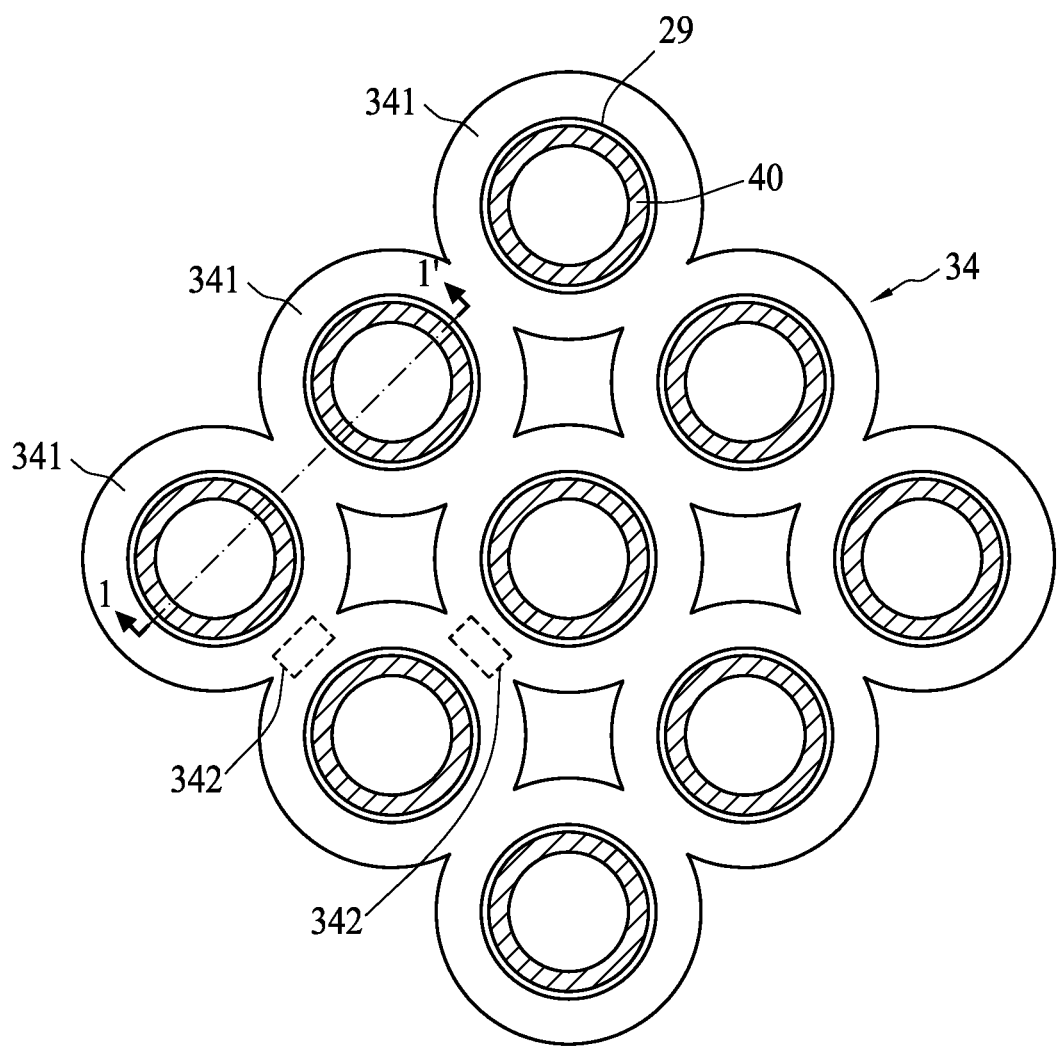
FIG. 9 is a top view showing a support frame and a plurality of electrodes according to one embodiment of the present invention.

FIG. 9 is a top view showing a support frame 34 and a plurality of electrodes 40 according to one embodiment of the present invention, and FIG. 7 is a cross-sectional view along line 1-1' of FIG. 9. Referring to FIGS. 6, 7 and 9, a CMP (chemical mechanical polishing) process is performed to remove an upper part of the sacrificial dielectric material 31 and an upper part of the layer of electrode material 30. The remnant sacrificial dielectric material 31 is etched away, and then a plurality of electrodes 40 supported by a support frame 34 are obtained.

As shown in FIG. 9, the support frame 34 is configured for supporting the plurality of electrodes 40. The support frame 34 may comprise a plurality of support structures 341 corresponding to the plurality of electrodes 40. Each support structure 341 is configured to surround the respective electrode 40. As can be seen in FIG. 9, the support structures 341 are connected. The support frame 34 may comprise a plurality of joint portions 342, which may comprise oxide of the second material.

Figure 8:
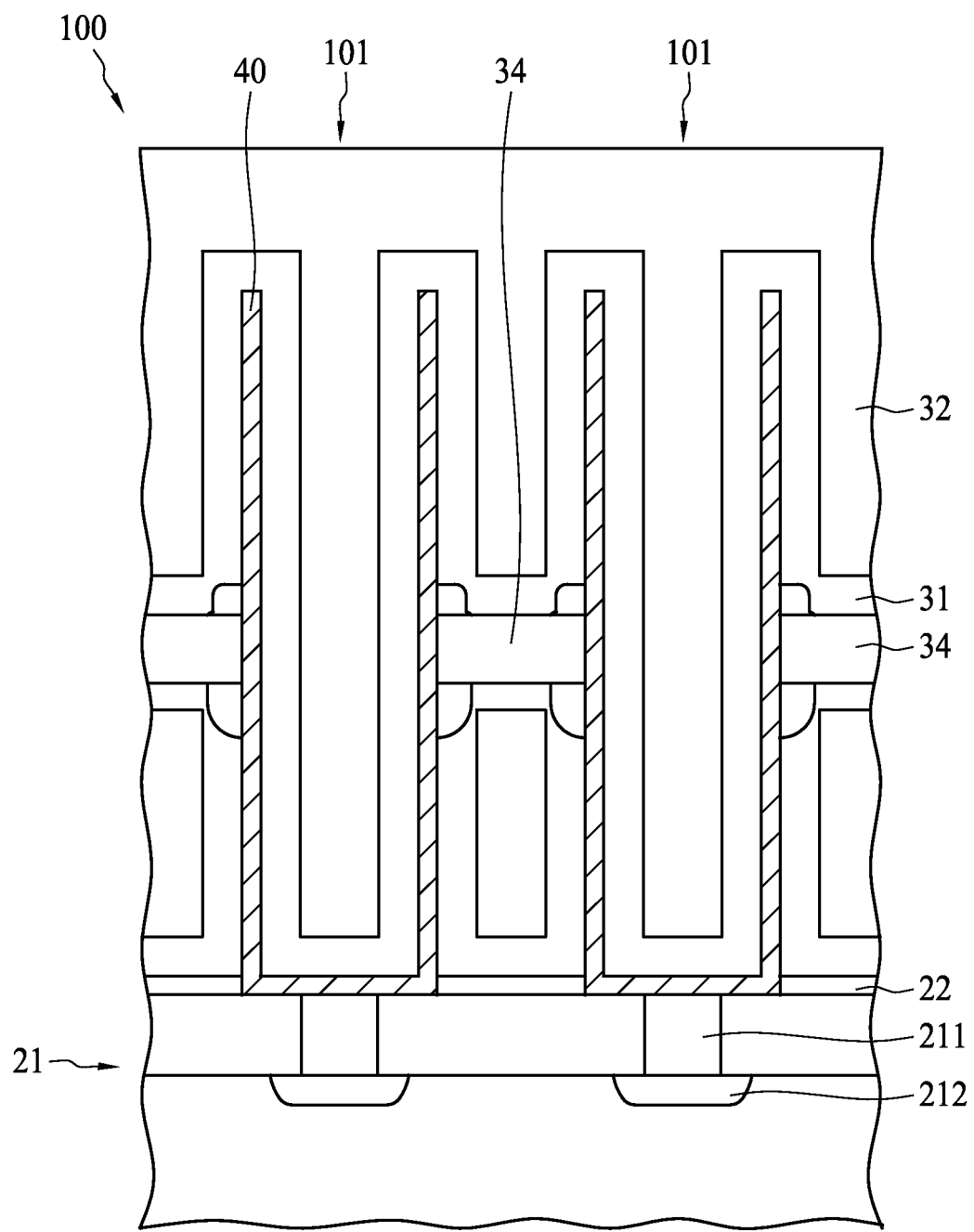

Referring to FIG. 8, a capacitor dielectric 31 is deposited on the exposed electrode 40 and the support frame 34. The capacitor dielectric 31 can have a dielectric constant higher than that of silicon dioxide. The capacitor dielectric 31 can be, for example, a metal oxide. Next, a material for another electrode 32 of the capacitor array 100 is deposited onto the capacitor dielectric 31 so as to obtain a plurality of capacitor 101. The second electrode 32 can comprise, for example, polysilicon.

Figure 10:
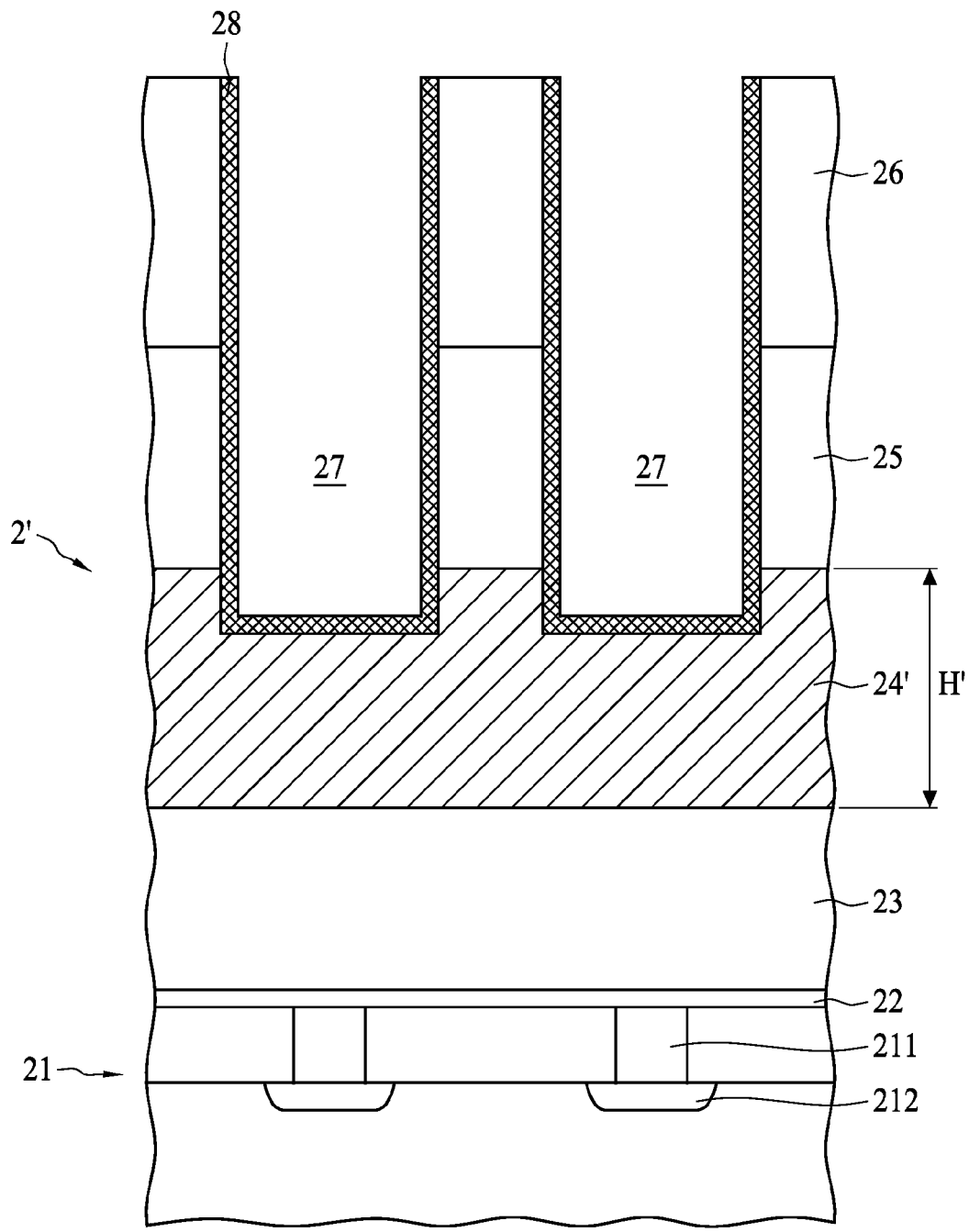
FIGS. 10 to 16 are cross-sectional views showing the steps of method of fabricating a capacitor array according to one embodiment of the present invention.

FIGS. 10 to 16 are cross-sectional views showing the steps of a method of fabricating a capacitor array 100' according to one embodiment of the present invention. Referring to FIG. 10, a substrate 2' is initially provided. The substrate 2' may comprise a first layer 25 of a first material and a layer 24' of a second material disposed below the first layer 25 of the first material. In some embodiments, the first material may be denser than the second material. In some embodiments, the first material comprises oxidizable material. In some embodiments, the second material comprises oxidizable material. In some embodiments, the first material may comprise undoped material or undoped oxidizable material. The second material may comprise doped material or doped oxidizable material. In some embodiments, the first material may comprise polysilicon. The second material may comprise doped polysilicon. In some embodiments, the substrate 2' may further comprise a second layer 23 of the first material, wherein the layer 24' of the second material is between the first and second layers 23 and 25 of the first material.

The substrate 2' may comprise a lower substrate portion 21 comprising a plurality of active areas 212 (i.e., source/drain regions of an access transistor) and a plurality of conductive plugs 211 connecting to the underlying corresponding active areas 212 (i.e., source/drain regions of an access transistor). The conductive plugs 211 may be conductively doped polysilicon plugs and can be separated by isolation material such as BPSG. The active areas 212 can be portions of field effect transistors previously formed by conventional fabrication steps known to those skilled in the art. The first layer 25 of the first material and the layer 24' of the second material are formed on the lower substrate portion.

Furthermore, the substrate 2' may further comprise a stop layer 22 formed on the lower substrate portion.

Referring to FIG. 10, a patterned mask 26 including a plurality of holes patterned to align with the conductive plugs 211 can be formed on the first layer 25 of the first material. The mask 26 may comprise carbon, oxide, nitride, or other material that can be used as a mask. Through the holes, a plurality of openings 27 are formed by, for example, a dry etch process, to the first layer 25 of the first material. Next, a liner layer 28 including, for example, silicon nitride (SiN) is formed in the openings 27 and the holes. In some embodiments, the liner layer 28 is formed by a plasma assisted nitridation process using $NH_3$. In some embodiments, the liner layer 28 is formed by an LPCVD nitridation.

In some embodiments, the openings 27 may be formed into the layer 24' of the second material.

Figure 11:
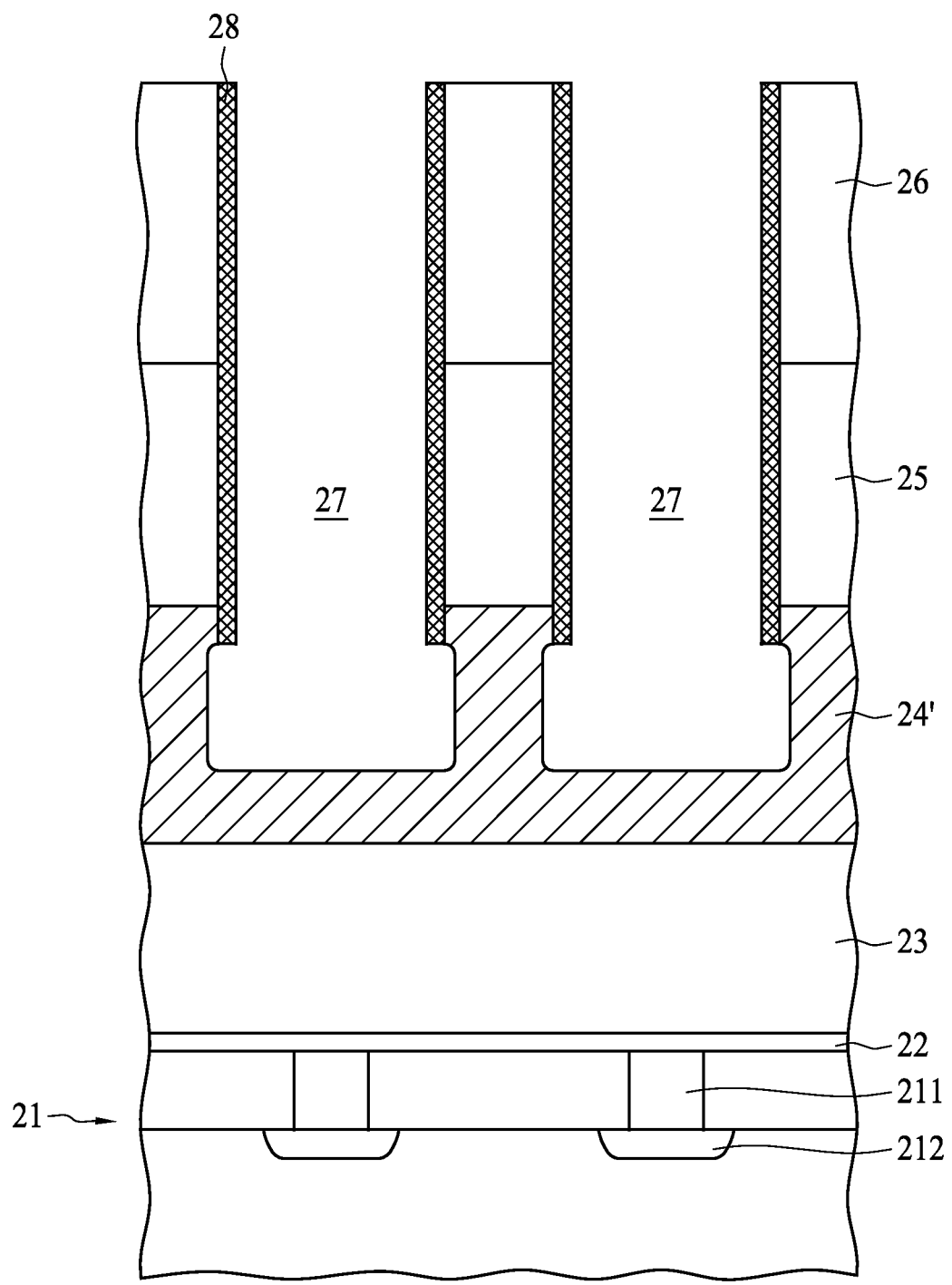

Referring to FIG. 11, a punch-thru etch is performed to remove the liner layers 28 on the bottoms of the openings 27. Next, an etching process is performed to deepen the openings 27, and an etched-out region including at least a portion of the layer 24 of the second material is obtained. In some embodiments, the deepening process is a dry etch process. In some embodiments, the deepening process is a wet etch process.

Figure 12:
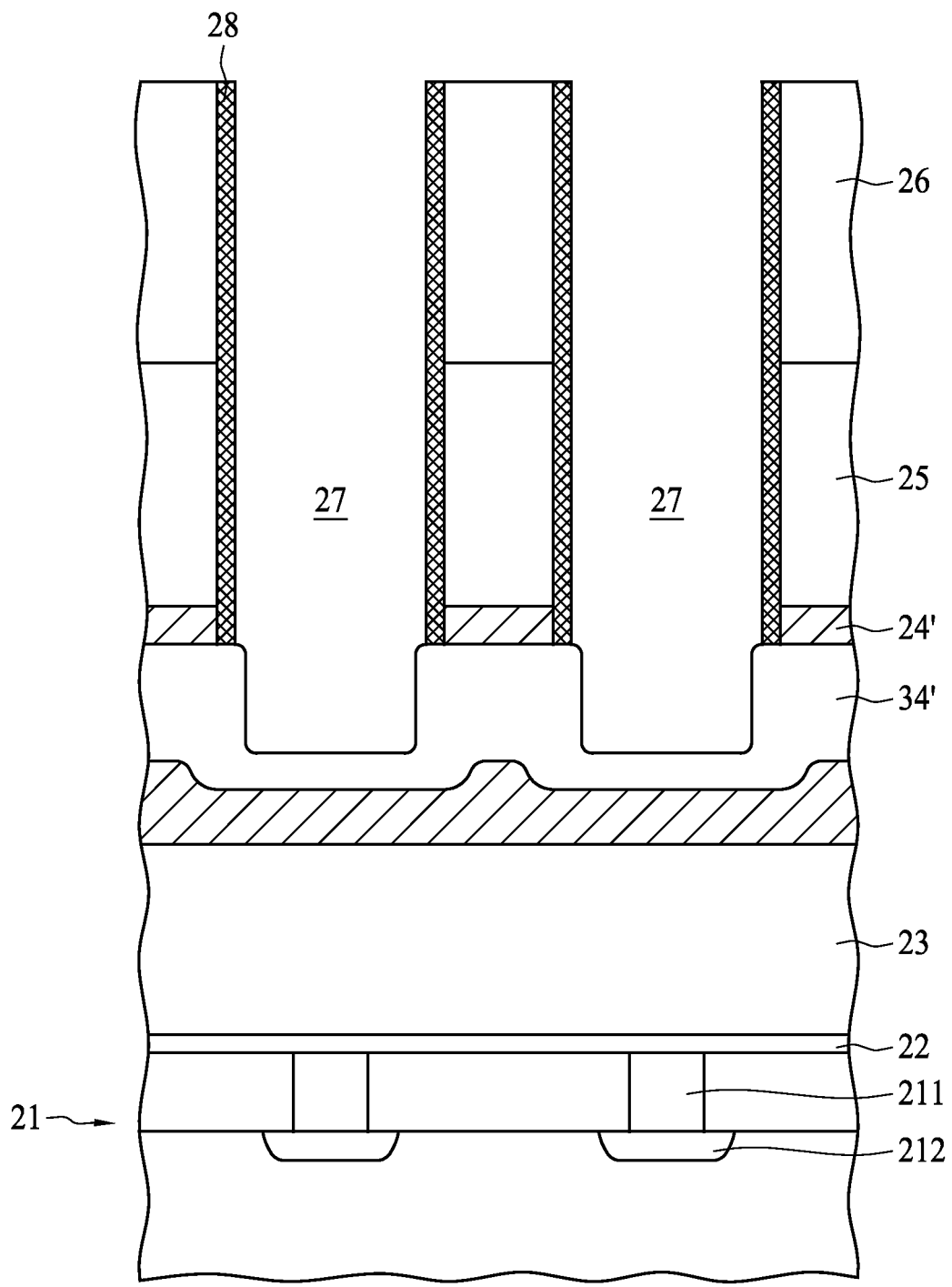

As shown in FIG. 12, an oxidation process is performed to oxidize the etched-out regions. In some embodiments, the second material can be partially oxidized via the etched-out regions. In some embodiments, the second material can be completely oxidized via the etched-out regions. The second material is oxidized to form a support frame 34'. In some embodiments, the portion mainly comprised of oxidized second material may comprise non-oxidized second material.

Figure 13:
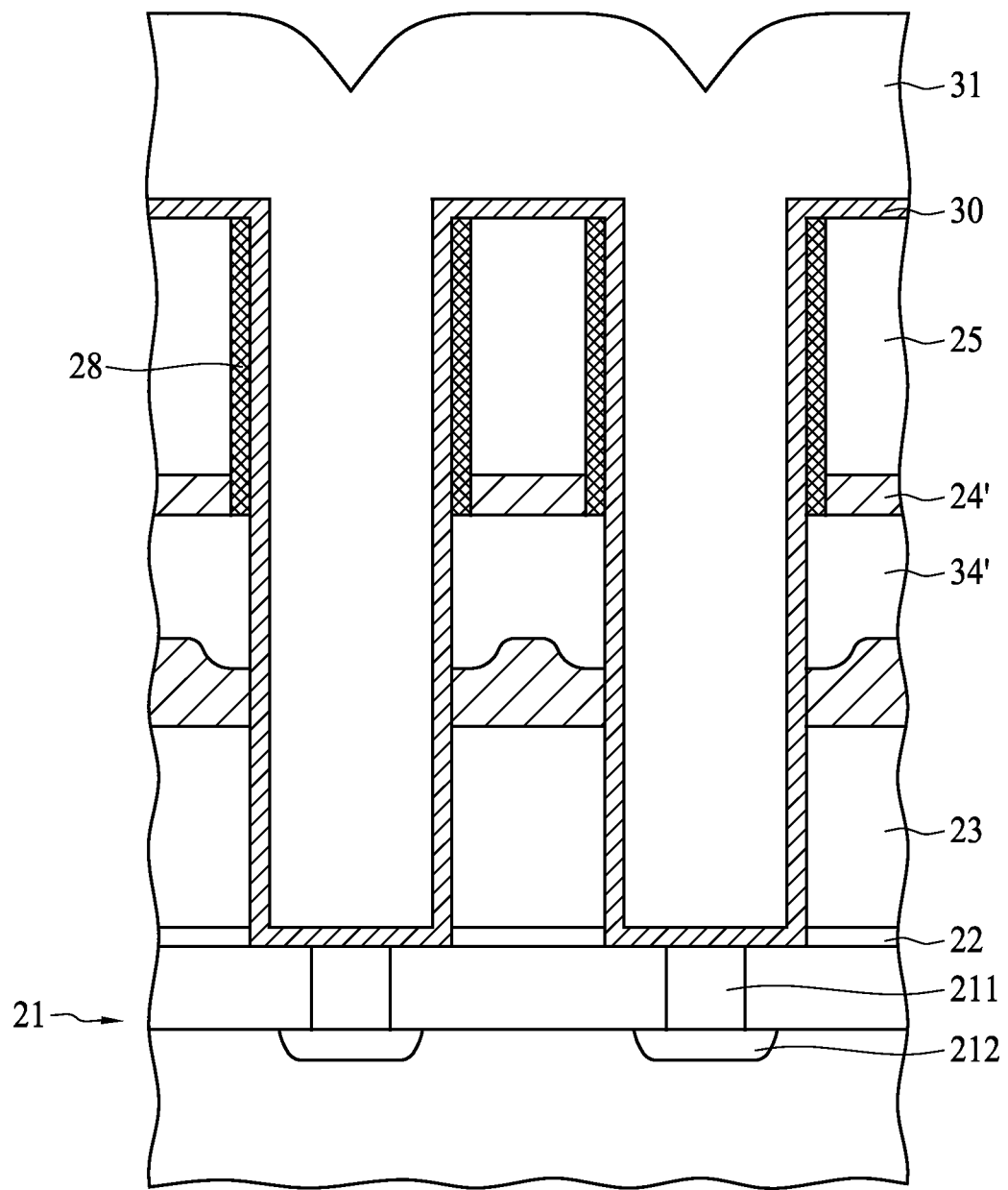

Referring to FIG. 13, an etching process is performed to further deepen the openings 27 until the stop layer 22 is reached. The exposed stop layer 22 is then removed. Next, the patterned mask 26 is removed. Thereafter, a layer of electrode material 30 is deposited. The electrode material 30 may comprise metal or polysilicon. Next, a sacrificial dielectric material 31 is deposited, covering the layer of electrode material 30. In some embodiments, the sacrificial dielectric material 31 may comprise undoped silica glass.

Figure 14:
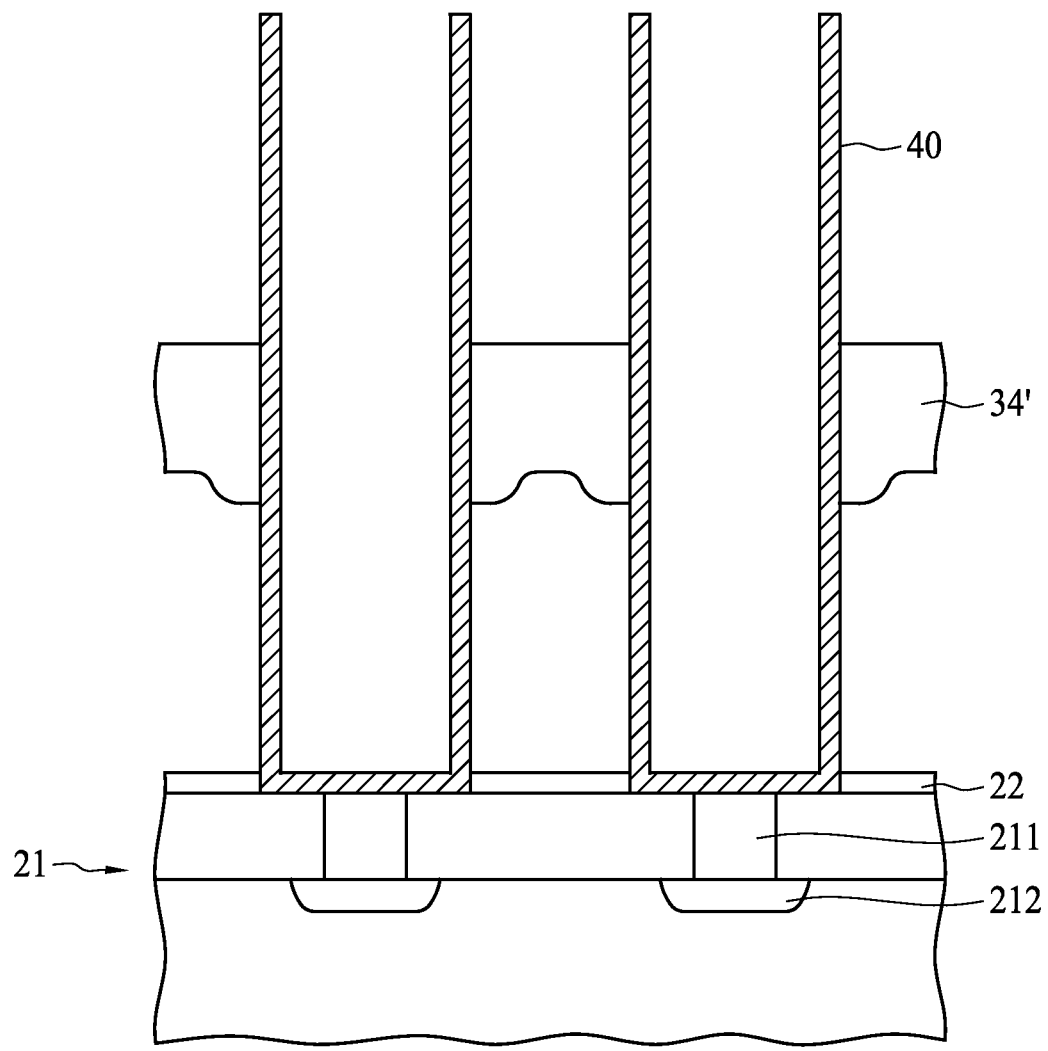
Figure 16:
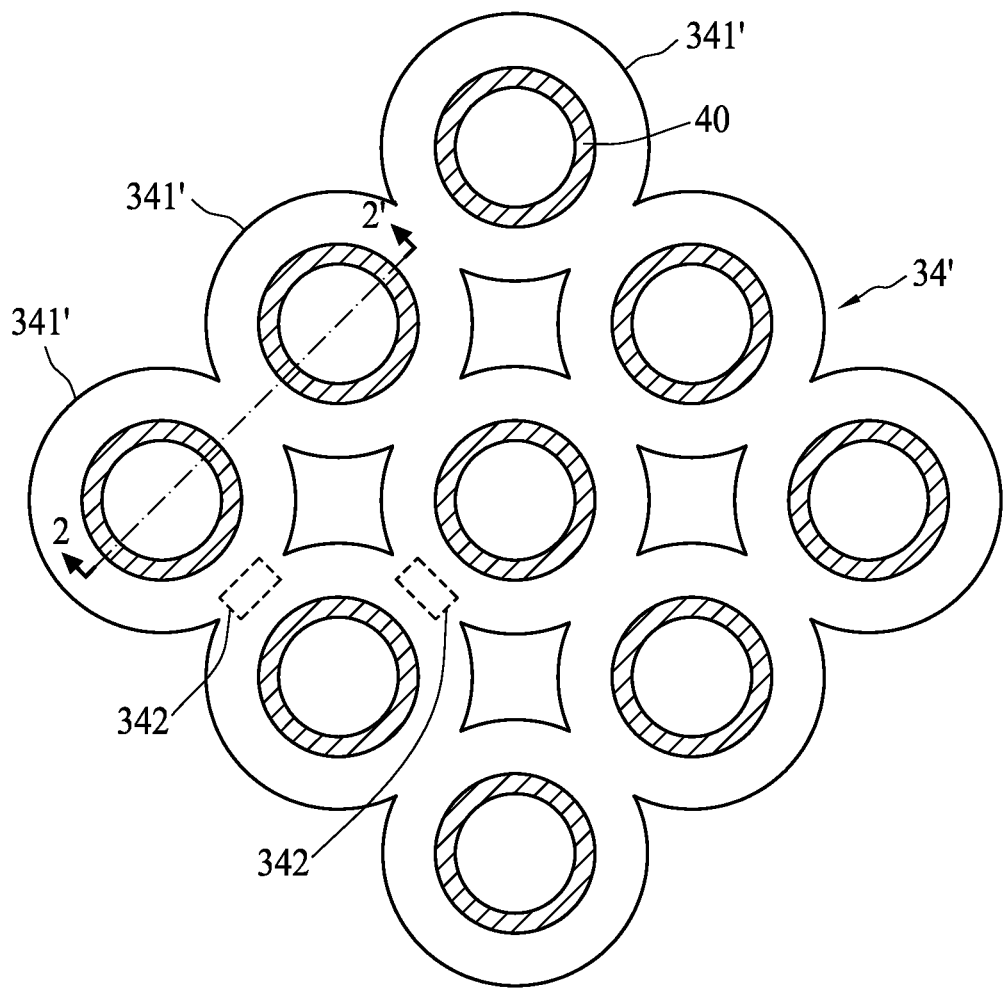

FIG. 16 is a top view showing a support frame 34' and a plurality of electrodes 40 according to another embodiment of the present invention, and FIG. 14 is a cross-sectional view along line 2-2' of FIG. 16. Referring to FIGS. 13, 14 and 16, a CMP (chemical mechanical polishing) process is performed to remove an upper part of the sacrificial dielectric material 31 and an upper part of the layer of electrode material 30. The remnant sacrificial dielectric material 31 is etched away, and a plurality of electrodes 40 supported by a support frame 34' are obtained.

As illustrated in FIG. 16, the support frame 34' is configured for supporting the plurality of electrodes 40. The support frame 34' may comprise a plurality of support structures 341' corresponding to the plurality of electrodes 40. Each support structure 341' is configured to surround the respective electrode 40. As can be seen in FIG. 16, the support structures 341' are connected. The support frame 34 may comprise a plurality of joint portions 342, which may comprise oxide of the second material.

Figure 15:
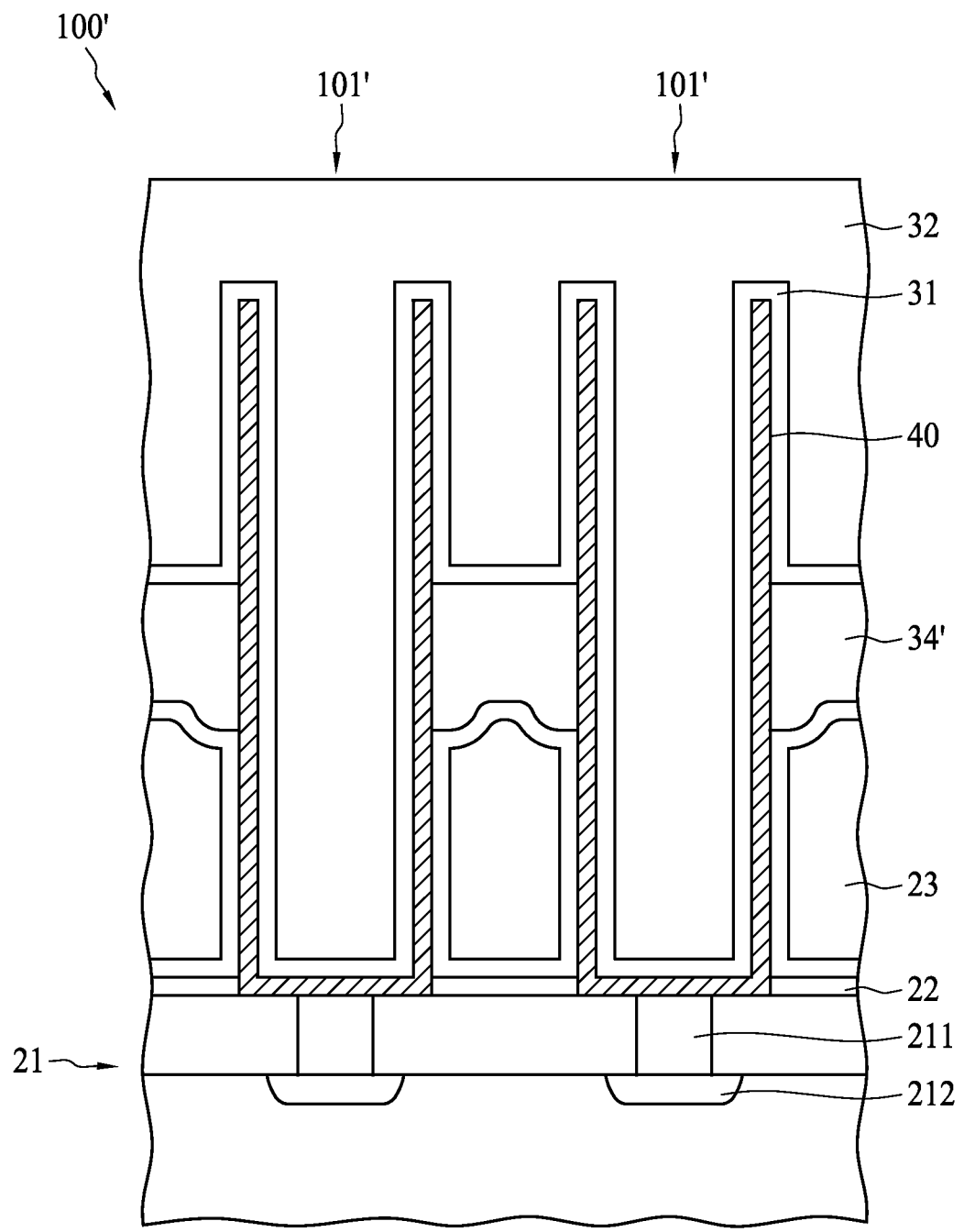

As shown in FIG. 15, a capacitor dielectric 31 is deposited on the exposed electrode 40 and the support frame 34. The capacitor dielectric 31 can have a dielectric constant higher than that of silicon dioxide. The capacitor dielectric 31 can be, for example, a metal oxide. Next, a material for another electrode 32 of the capacitor array 100' is deposited onto the capacitor dielectric 31 so as to obtain a plurality of capacitor 101'. The second electrode 32 can comprise, for example, polysilicon.

In some embodiments, a plurality of support frames can be provided to support the electrodes of a capacitor array. To this end, a plurality of layers of the second material corresponding to the support frames are provided. A plurality of layers of the first material separate the plurality of layers of the second material, and one layer of the first material can be formed on the top of the stacked layers. The above-mentioned processes are performed, for example, for oxidizing the layers of the second material one after another until all layers of the second material are oxidized to become corresponding support frames.

The thickness of the support frame is not specifically limited. In some embodiments, a ratio of a height of the electrode to a thickness of the support frame is in a range of from 20:1 to 8:1. In some embodiments, a ratio of a thickness of the first layer of the first material to a thickness of the layer of the second material is in a range of from 10:1 to 4:1.

Although the present invention and its objectives have been described in detail, it should be understood that various changes, substitutions and alterations can be made herein without departing from the spirit and scope of the invention as defined by the appended claims For example, many of the processes discussed above can be implemented in different methodologies and replaced by other processes, or a combination thereof Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A capacitor array, comprising:
   a plurality of capacitors each comprising an upstanding electrode; and
   a support frame configured for supporting the plurality of upstanding electrodes, the support frame comprising a plurality of support structures corresponding to the plurality of electrodes, each support structure surrounding the respective electrode, the support frame comprising an oxide of polysilicon, wherein
   each of the plurality of electrodes includes a cylindrical electrode having an inner surface and an outer surface, and a capacitor dielectric material formed to cover and directly contact with substantially an entirety of the inner and outer surfaces of each of the cylindrical electrodes.

2. The capacitor array of claim 1, wherein the support frame further comprises an oxide of undoped polysilicon.

3. The capacitor array of claim 1, wherein the support frame further comprises an oxide of doped polysilicon.

4. The capacitor array of claim 1, wherein a ratio of a height of the electrode to a thickness of the support frame is in a range of from 20:1 to 8:1.

5. A capacitor array, comprising:
   a plurality of capacitors each comprising an upstanding electrode; and
   a support frame configured for supporting the plurality of upstanding electrodes, the support frame comprising a plurality of support structures corresponding to the plurality of electrodes, each support structure surrounding the respective electrode, the support frame comprising a first material having a first density and a second material having a second density, wherein the first density is higher than the second density, and
   each of the plurality of electrodes includes a cylindrical electrode having an inner surface and an outer surface, and a capacitor dielectric material formed to cover and directly contact with substantially an entirety of the inner and outer surfaces of each of the cylindrical electrodes.

6. The capacitor array of claim 5, wherein the support frame comprises a plurality of joint portions connecting the support structures together, wherein the joint portion comprises the second material.

7. The capacitor array of claim 5, wherein the first material comprises oxide of undoped polysilicon.

8. The capacitor array of claim 5, wherein the second material comprises oxide of doped polysilicon.

9. The capacitor array of claim 5, wherein a ratio of a height of the electrode to a thickness of the support frame is in a range of from 20:1 to 8:1.

10. The capacitor array of claim 1, wherein the support frame is positioned along a plane perpendicular to the plurality of upstanding electrodes.

11. The capacitor array of claim 5, wherein the support frame is positioned along a plane perpendicular to the plurality of upstanding electrodes.

12. The capacitor array of claim 1, further comprising:
a top electrode formed on the capacitor dielectric material to cover and directly contact with substantially an entirety of the capacitor dielectric material covering the inner and outer surfaces of each of the cylindrical electrodes.

13. The capacitor array of claim 5, further comprising:
a top electrode formed on the capacitor dielectric material to cover and directly contact with substantially an entirety of the capacitor dielectric material covering the inner and outer surfaces of each of the cylindrical electrodes.

* * * * *